US012744544B2

(12) United States Patent
Wu et al.

(10) Patent No.: US 12,744,544 B2
(45) Date of Patent: Sep. 22, 2026

(54) PIPELINED ANALOG-TO-DIGITAL CONVERTER (ADC) AND RESIDUAL VOLTAGE GENERATION CIRCUIT AND GENERATION METHOD THEREOF

(71) Applicant: Joulwatt Technology (Shenzhen) Co., Ltd., Shenzhen (CN)

(72) Inventors: Huigui Wu, Shenzhen (CN); Kun An, Shenzhen (CN)

(73) Assignee: Jouiwatt Technology (Shenzhen) Co., Ltd., Shenzhen (CN)

( * ) Notice: Subject to any disclaimer, the term of this patent is extended or adjusted under 35 U.S.C. 154(b) by 121 days.

(21) Appl. No.: 18/973,134

(22) Filed: Dec. 9, 2024

(65) Prior Publication Data

US 2025/0202495 A1 Jun. 19, 2025

(30) Foreign Application Priority Data

Dec. 15, 2023 (CN) ......................... 202311743510.3

(51) Int. Cl.

| | |
|---|---|
| ***H03M 1/14*** | (2006.01) |
| ***H03F 1/02*** | (2006.01) |
| ***H03M 1/06*** | (2006.01) |
| ***H03M 1/12*** | (2006.01) |
| ***H03M 1/16*** | (2006.01) |

(52) U.S. Cl.
CPC .......... *H03M 1/145* (2013.01); *H03F 1/0211* (2013.01); *H03M 1/0695* (2013.01); *H03M 1/12* (2013.01); *H03M 1/164* (2013.01)

(58) Field of Classification Search
CPC .... H03M 1/145; H03M 1/0695; H03M 1/164; H03M 1/12; H03F 1/0211
USPC ................................................. 341/155, 161
See application file for complete search history.

(56) References Cited

U.S. PATENT DOCUMENTS 8,884,803 B2 * 11/2014 Chen .................. H03M 1/1225
341/161
10,256,834 B1 * 4/2019 Kinyua ................ H03M 1/145

* cited by examiner

*Primary Examiner* — Khai M Nguyen
(74) *Attorney, Agent, or Firm* — Bayramoglu Law Offices LLC

(57) ABSTRACT

A pipelined analog-to-digital converter (ADC) and a residual voltage generation circuit and generation method thereof are provided. A common mode voltage ADC is configured to convert a common mode voltage of an input signal into a first digital signal; a digital signal processing module is configured to receive the first digital signal and a second digital signal obtained by rough conversion of the input signal by an ADC and output a third digital signal and a fourth digital signal based on the first digital signal and the second digital signal, respectively; a sub-digital-to-analog converter (DAC) is configured to receive the input signals and a switching control signal and output a residual voltage; and based on the third digital signal and the fourth digital signal, a common mode voltage of the residual voltage is approximately equal to a set threshold voltage.

20 Claims, 7 Drawing Sheets

PIPELINED ANALOG-TO-DIGITAL CONVERTER (ADC) AND RESIDUAL VOLTAGE GENERATION CIRCUIT AND GENERATION METHOD THEREOF

CROSS-REFERENCE TO THE RELATED APPLICATIONS

This application is based upon and claims priority to Chinese Patent Application No. 202311743510.3, filed on Dec. 15, 2023, the entire contents of which are incorporated herein by reference.

TECHNICAL FIELD

The present disclosure relates to the field of analog-to-digital converters (ADCs) and in particular to a pipelined ADC and a residual voltage generation circuit and generation method thereof.

BACKGROUND

Pipelined analog-to-digital converter (ADC) is a commonly used ADC structure, which has the advantages of fast speed and high accuracy. FIG. 1 shows a typical two-stage differential pipelined structure, which includes a first ADC (ADC1), an encoder, a sub-DAC1, a redundant amplifier RA, a second ADC (ADC2), a redundant correction circuit, etc. The encoder and sub-DAC1 form a residual voltage generation circuit 10. The first ADC (ADC1) holds N1 bits, the second ADC (ADC2) holds N2 bits, and there are RB redundant bits. The final output digital signal of the pipelined structure ADC holds N=N1+N2-RB bits. FIG. 2A is a schematic diagram of the sub-DAC1 during a sampling phase. In the figure, the sub-DAC1 includes a first capacitor array 100-1 and a second capacitor array 100-2, and residual voltages VP_DAC1 and VN_DAC1 are generated based on the connection of capacitors in the two capacitor arrays. During the sampling phase, switches S1 and S2 are closed, and the first terminals of the two capacitor arrays are connected to a common mode signal VCM that is half of a reference voltage VREF. The second terminal of the first capacitor array 100-1 is connected to a positive terminal VIP of an input signal, and the second terminal of the second capacitor array 100-2 is connected to a negative terminal VIN of the input signal. This phase is designed to sample the input signal. FIG. 2B shows a residual voltage generation phase. In this phase, the switches S1 and S2 are opened, and the second terminal of the first capacitor array 100-1 is connected to a ground GND or the reference voltage VREF through a first switch array 200-1. The second terminal of the second capacitor array 100-2 is connected to the ground GND or the reference voltage VREF through a second switch array 200-2. The first switch array 200-1 and the second switch array 200-2 are respectively controlled by switching control signals SWP<N1-1:0> and SWN<N1-1:0> generated by the encoder based on the digital signal D1<N1-1:0> output by the first ADC (ADC1). Assuming that the voltage at the second terminal of the first capacitor array 100-1 is equivalent to VBP and the voltage at the second terminal of the second capacitor array 100-2 is equivalent to VBN, the residual voltages calculated based on the principle of charge conservation on the capacitors are VP_DAC1=VCM+VBP−VIP and VN_DAC1=VCM+VBN−VIN, respectively. Therefore, the common mode voltage of the residual voltages is (VP_DAC1+VN_DAC1)/2=VCM+ (VBP+VBN)/2−(VIP+VIN)/2. Since the switching control signals SWP<N1-1:0> and SWN<N1-1:0> are generated based on the digital signal output by the first ADC (ADC1), VBP+VBN=VREF, and the common mode voltage of the residual voltages is equal to VREF−(VIP+VIN)/2. From this equation, it can be seen that the common mode voltage of the residual voltages generated by this structure is related to the input signal. In a residual amplification phase, switches S3, S4, S5, and S6 are closed, and the residual voltages are applied to the redundant amplifier RA. Therefore, the common mode voltage input into the amplifier changes with the input signal. If the voltage change range is too large, the amplifier design will become very difficult. In addition, the change in the common mode voltage of the amplifier will cause changes in the offset voltage and cause other problems. Therefore, it is necessary to address the technical problems existing in the prior art.

SUMMARY

In order to address the above-mentioned technical problems existing in the prior art, the present disclosure provides a pipelined analog-to-digital converter (ADC) and a residual voltage generation circuit and generation method thereof.

A first aspect of the present disclosure provides a residual voltage generation circuit, applied to a pipelined analog-to-digital converter (ADC), and including:

- a common mode voltage ADC, configured to receive an input signal and convert a common mode voltage of the input signal into a first digital signal;
- an ADC, configured to receive the input signal and convert the input signal into a second digital signal;
- a digital signal processing module, configured to receive the first digital signal and the second digital signal and output a third digital signal and a fourth digital signal; and
- a sub-digital-to-analog converter (DAC), configured to receive the input signal and a switching control signal and output a residual voltage, where the switching control signal is generated based on the third digital signal and the fourth digital signal; and
- where, based on the third digital signal and the fourth digital signal, a common mode voltage of the residual voltage generated by the sub-DAC is approximately equal to a set threshold voltage.

Optionally, when a number of bits of the first digital signal is equal to a number of bits of the second digital signal, the third digital signal is equal to a difference by subtracting a binary value corresponding to 2^(N1-1) from a sum of the first digital signal and the second digital signal; the fourth digital signal is equal to a difference by subtracting the second digital signal from a sum of a binary value corresponding to (2^(N1-1)−1) and the first digital signal; and N1 denotes the number of bits of the second digital signal; and

- when the number of bits of the first digital signal is not equal to the number of bits of the second digital signal, the digital signal processing module includes a number-of-bits conversion module for converting the number of bits of the first digital signal to be equal to the number of bits of the second digital signal; thus, the third digital signal is equal to a difference by subtracting the binary value corresponding to 2^(N1-1) from a sum of the first digital signal converted to hold N1 bits and the second digital signal; and the fourth digital signal is equal to a difference by subtracting the second digital signal from a sum of the binary value corresponding to (2^(N1-1)−1) and the first digital signal converted to hold N1 bits.

Optionally, a difference between the third digital signal and the fourth digital signal is defined as a first difference;

the digital signal processing module is configured to limit decimal values corresponding to the third digital signal and the fourth digital signal to a range of 0 to (2^N1-1);

when the decimal value corresponding to the third digital signal is less than 0 or greater than (2^N1-1), the decimal value corresponding to the third digital signal is shifted into the range of 0 to (2^N1-1), and the first difference remains unchanged; and when the decimal value corresponding to the fourth digital signal is less than 0 or greater than (2^N1-1), the decimal value corresponding to the fourth digital signal is shifted into the range of 0 to (2^N1-1), and the first difference remains unchanged.

Optionally, the digital signal processing module includes a first digital conversion module, a codeword transfer module, and a second digital conversion module;

the first digital conversion module is configured to output a first conversion signal based on the first digital signal and output a second conversion signal based on the second digital signal;

the codeword transfer module is configured to output a third conversion signal and a fourth conversion signal based on the first conversion signal and the second conversion signal, and make a sum of the third conversion signal and the fourth conversion signal approximately twice the first conversion signal and a decimal difference between the third conversion signal and the fourth conversion signal equal to a difference between a double of a decimal value of the second conversion signal and (2^N1-1); and N1 denotes a number of bits of the second digital signal; and the second digital conversion module is configured to output the third digital signal based on the third conversion signal and output the fourth digital signal based on the fourth conversion signal.

Optionally, when the first to fourth conversion signals are decimal signals, the third conversion signal is equal to a difference by subtracting (2^N1-1) from a sum of the second conversion signal and the first conversion signal; and the fourth conversion signal is equal to a difference by subtracting the second conversion signal from a sum of (2^(N1-1)−1) and the first conversion signal.

Optionally, a difference between the third conversion signal and the fourth conversion signal is defined as a first difference;

the codeword transfer module is configured to limit the third conversion signal and the fourth conversion signal to a range of 0 to (2^N1-1);

when the third conversion signal is less than 0 or greater than (2^N1-1), the third conversion signal is shifted into the range of 0 to (2^N1-1), and the first difference remains unchanged; and when the fourth conversion signal is less than 0 or greater than (2^N1-1), the fourth conversion signal is shifted into the range of 0 to (2^N1-1), and the first difference remains unchanged.

Optionally, the set threshold voltage is half of a reference voltage.

Optionally, the residual voltage generation circuit further includes an encoder; and the encoder is configured to receive the third digital signal and the fourth digital signal and output a first switching control signal and a second switching control signal; and the sub-DAC is configured to generate the residual voltage based on the input signal, the first switching control signal, and the second switching control signal.

Optionally, the sub-DAC includes a first capacitor array and a second capacitor array;

a first terminal of the first capacitor array is connected to a common mode signal through a first switch; and in the first capacitor array, a second terminal of a capacitor is connected to one of a positive terminal of the input signal, a positive terminal of the reference voltage, and a negative terminal of the reference voltage through a first switch array;

a first terminal of the second capacitor array is connected to the common mode signal through a second switch; and in the second capacitor array, a second terminal of a capacitor is connected to one of a negative terminal of the input signal, the positive terminal of the reference voltage, and the negative terminal of the reference voltage through a second switch array;

in a sampling phase, the first switch and the second switch are closed, a second terminal of the first capacitor array is connected to the positive terminal of the input signal, and a second terminal of the second capacitor array is connected to the negative terminal of the input signal; and in a residual voltage generation phase, the first switch and the second switch are opened, the first switch array is controlled by the first switching control signal, and the second switch array is controlled by the second switching control signal.

The present disclosure further provides a pipelined ADC, including cascaded structures of K stages, K being a positive integer greater than 1, where a cascaded structure other than a Kth stage includes the above residual voltage generation circuit;

an ith-stage cascaded circuit is configured to output an ith amplified signal based on the residual voltage generated by the sub-DAC in the ith-stage cascaded circuit, i being a positive integer greater than or equal to 1 and less than K;

an input signal in a first-stage cascade circuit is an analog signal to be converted; and input signals in cascaded circuits of second to Kth stages each are an amplified signal generated by a previous-stage cascaded circuit;

the input signal in the ith-stage cascaded circuit is the input signal of the residual voltage generation circuit in the ith-stage cascaded circuit; and based on the second digital signals output by the ADCs in the cascaded structures of first to (K−1)th stages and a fifth digital signal output by the ADC in the Kth-stage cascaded circuit, the pipelined ADC outputs a sixth digital signal through redundant correction.

Optionally, the ith-stage cascade circuit includes a redundant amplifier; and the redundant amplifier is a differential operational amplifier that is configured to amplify the residual voltage in the ith-stage cascaded circuit and output the ith amplified signal.

The present disclosure further provides a residual voltage generation method, including the following steps:

converting, by a common mode voltage ADC, a common mode voltage of an input signal into a first digital signal;

converting, by an ADC, the input signal into a second digital signal;

receiving, by a digital signal processing module, the first digital signal and the second digital signal, and outputting a third digital signal and a fourth digital signal; and receiving, by a sub-DAC, the input signal and a switching control signal generated based on the third digital signal and the fourth digital signal, and outputting a residual voltage;

and where, based on the third digital signal and the fourth digital signal, a common mode voltage of the residual voltage generated by the sub-DAC is approximately equal to a set threshold voltage.

Optionally, the receiving, by a digital signal processing module, the first digital signal and the second digital signal, and outputting a third digital signal and a fourth digital signal includes:

when a number of bits of the first digital signal is equal to a number of bits of the second digital signal, the third digital signal is equal to a difference by subtracting a binary value corresponding to 2^(N1-1) from a sum of the first digital signal and the second digital signal; the fourth digital signal is equal to a difference by subtracting the second digital signal from a sum of a binary value corresponding to (2^(N1-1)−1) and the first digital signal; and N1 denotes the number of bits of the second digital signal; and when the number of bits of the first digital signal is not equal to the number of bits of the second digital signal, the digital signal processing module includes a number-of-bits conversion module for converting the number of bits of the first digital signal to be equal to the number of bits of the second digital signal; thus, the third digital signal is equal to a difference by subtracting the binary value corresponding to 2^(N1-1) from a sum of the first digital signal converted to hold N1 bits and the second digital signal; and the fourth digital signal is equal to a difference by subtracting the second digital signal from a sum of the binary value corresponding to (2^(N1-1)−1) and the first digital signal converted to hold N1 bits.

Optionally, a difference between the third digital signal and the fourth digital signal is defined as a first difference;

the digital signal processing module is configured to limit decimal values corresponding to the third digital signal and the fourth digital signal to a range of 0 to (2^N1-1);

when the decimal value corresponding to the third digital signal is less than 0 or greater than (2^N1-1), the decimal value corresponding to the third digital signal is shifted into the range of 0 to (2^N1-1), and the first difference remains unchanged; and when the decimal value corresponding to the fourth digital signal is less than 0 or greater than (2^N1-1), the decimal value corresponding to the fourth digital signal is shifted into the range of 0 to (2^N1-1), and the first difference remains unchanged.

Optionally, the receiving, by a digital signal processing module, the first digital signal and the second digital signal, and outputting a third digital signal and a fourth digital signal includes: outputting, by the first digital conversion module, a first conversion signal based on the first digital signal, and outputting a second conversion signal based on the second digital signal;

outputting, by a codeword transfer module, a third conversion signal and a fourth conversion signal based on the first conversion signal and the second conversion signal, and making a sum of the third conversion signal and the fourth conversion signal approximately twice the first conversion signal and a decimal difference between the third conversion signal and the fourth conversion signal equal to a difference between a double of a decimal value of the second conversion signal and (2^N1-1), where N1 denotes a number of bits of the second digital signal; and outputting, by a second digital conversion module, the third digital signal based on the third conversion signal, and outputting the fourth digital signal based on the fourth conversion signal.

Optionally, when the first to fourth conversion signals are decimal signals, the third conversion signal is equal to a difference by subtracting (2^N1-1) from a sum of the second conversion signal and the first conversion signal and (2^N1-1); and the fourth conversion signal is equal to a difference by subtracting the second conversion signal from a sum of (2^(N1-1)−1) and the first conversion signal.

Optionally, a difference between the third conversion signal and the fourth conversion signal is defined as a first difference;

the codeword transfer module is configured to limit the third conversion signal and the fourth conversion signal to a range of 0 to (2^N1-1);

when the third conversion signal is less than 0 or greater than (2^N1-1), the third conversion signal is shifted into the range of 0 to (2^N1-1), and the first difference remains unchanged; and when the fourth conversion signal is less than 0 or greater than (2^N1-1), the fourth conversion signal is shifted into the range of 0 to (2^N1-1), and the first difference remains unchanged.

Optionally, the set threshold voltage is half of a reference voltage.

The present disclosure has at least the following beneficial effects.

In summary, the present disclosure provides a pipelined ADC and a residual voltage generation circuit and generation method thereof. The common mode voltage ADC is provided to convert the common mode voltage of the input signals into the first digital signal. The digital signal processing module is provided to receive the first digital signal and the second digital signal obtained by rough conversion of the input signal by the ADC, and output the third digital signal and the fourth digital signal based on the first digital signal and the second digital signal, respectively. The sub-DAC receives the input signals and the switching control signals generated based on the third digital signal and the fourth digital signal, and outputs the residual voltages. Based on the third digital signal and the fourth digital signal, the common mode voltage of the residual voltages generated by the sub-DAC is approximately equal to the set threshold voltage. That is, it is stabilized around the set threshold voltage. The set threshold can be set according to the actual application situation, for example, it can be set to half of the reference voltage. Through the above settings, the present disclosure avoids problems such as offset voltage changes caused by large-scale fluctuations in the common mode voltage of the residual voltages and reduces the difficulty of amplifier design.

It should be noted that the above general description and the following detailed description are only exemplary and explanatory, and should not be construed as a limitation to the present disclosure.

DETAILED DESCRIPTION OF THE EMBODIMENTS

Figure 1:
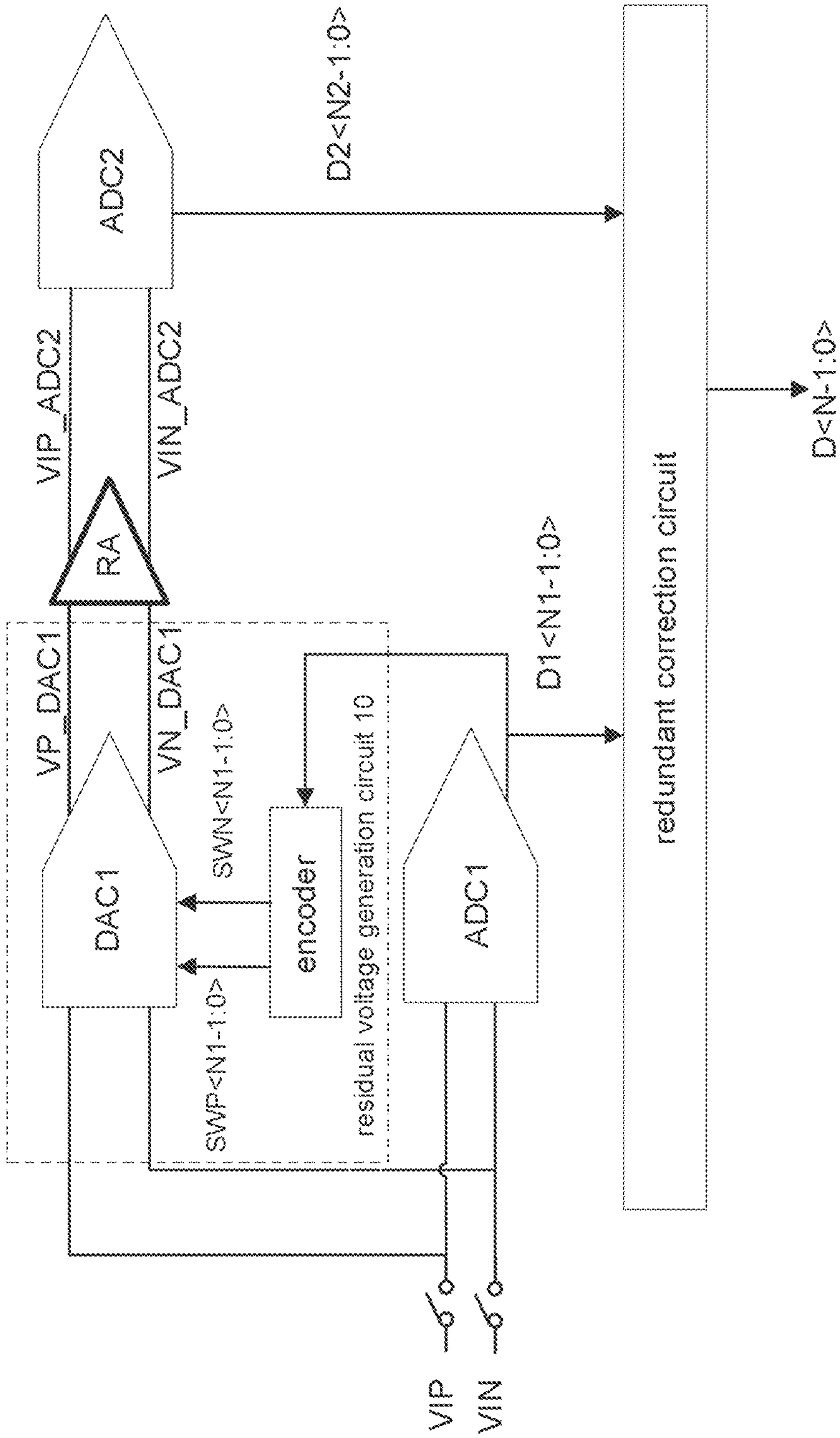
FIG. 1 is a schematic diagram of a two-stage differential pipelined analog-to-digital converter (ADC) in the prior art.

To facilitate the understanding of the present disclosure, the present disclosure is described more completely below with reference to the drawings. Preferred embodiments of the present disclosure are shown in the drawings. However, the present disclosure can be embodied in various forms without being limited to the embodiments set forth herein. On the contrary, these embodiments are provided to make the present disclosure more thoroughly and comprehensively understood.

Figure 2A:
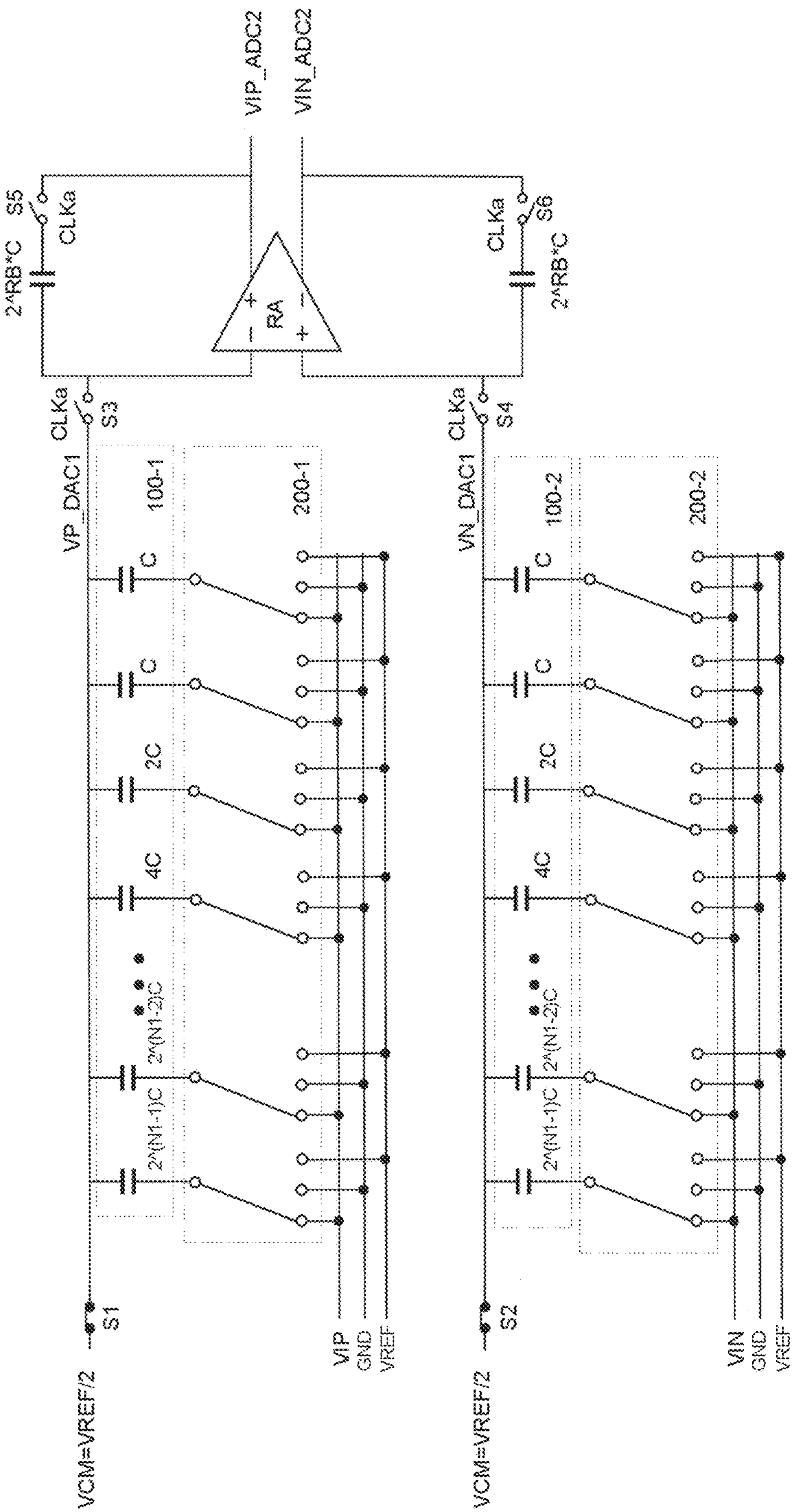
FIG. 2A is a schematic diagram of a sub-digital-to-analog converter (DAC) shown in FIG. 1 during a sampling phase.
Figure 2B:
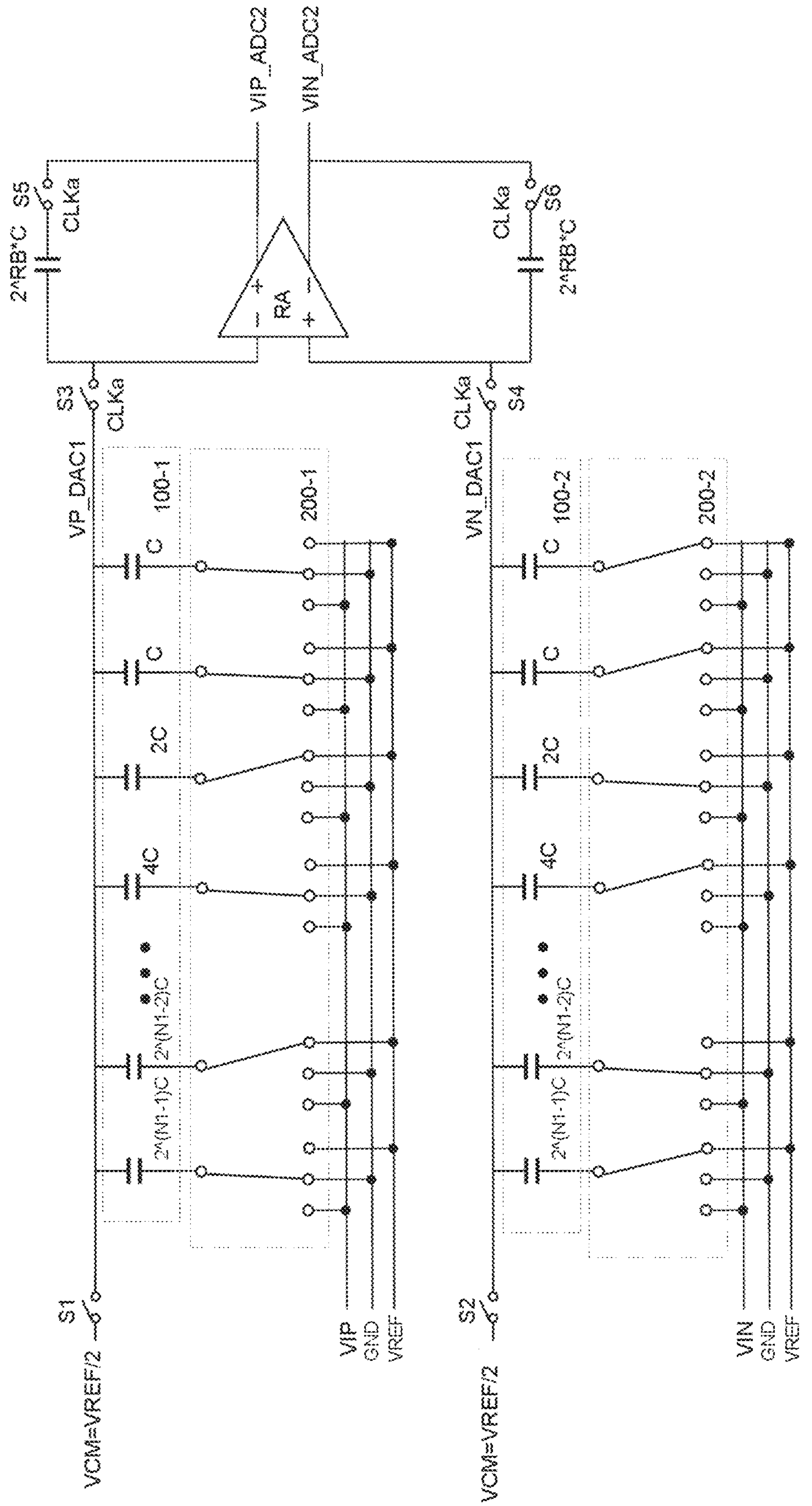
FIG. 2B is a schematic diagram of the sub-DAC shown in FIG. 1 during a residual generation phase.
Figure 3:
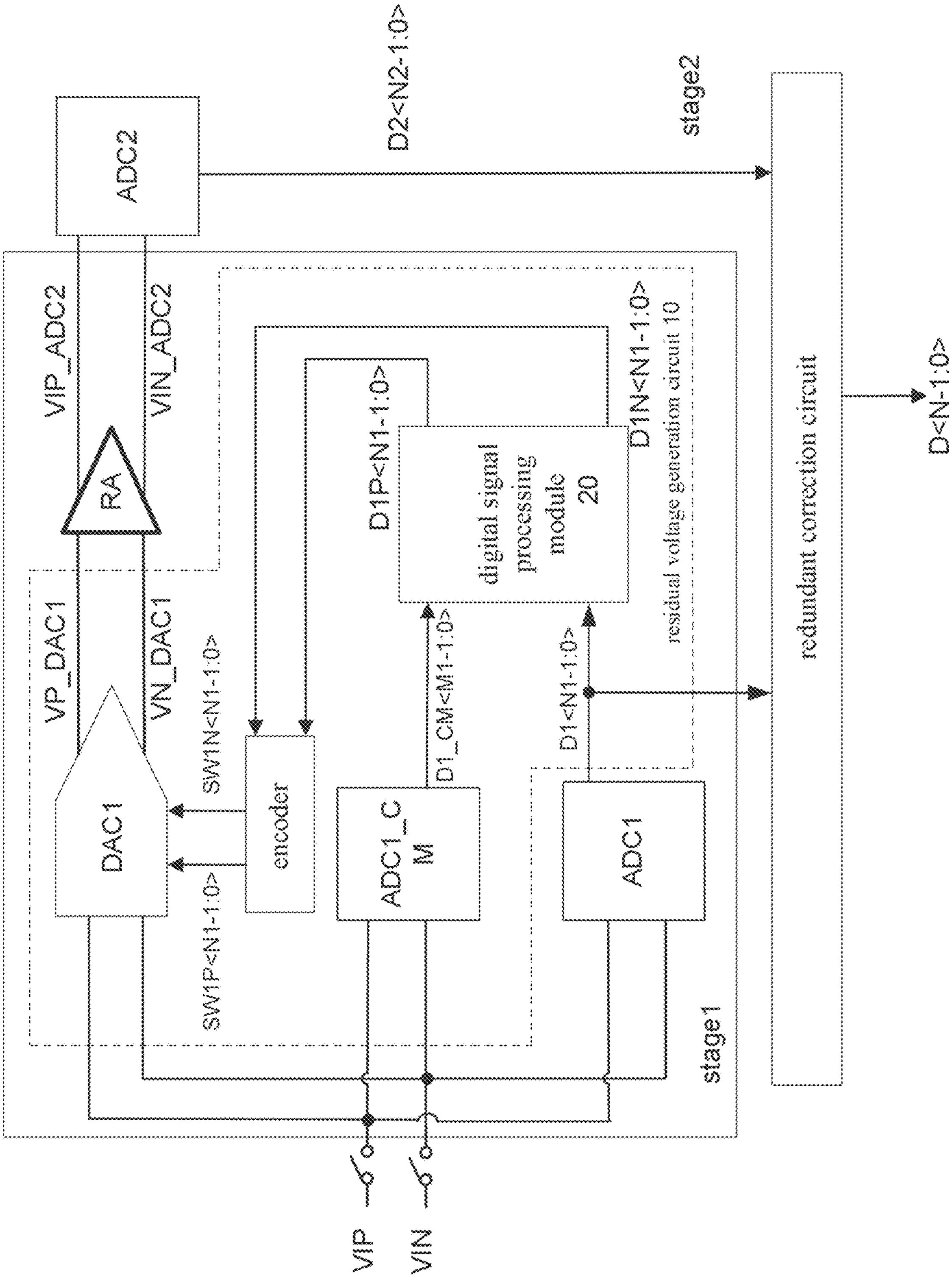
FIG. 3 is a schematic diagram of a two-stage pipelined ADC and a residual voltage generation circuit thereof according to the present disclosure.

FIG. 3 is a schematic diagram of a two-stage pipelined analog-to-digital converter (ADC) provided by the present disclosure. The two-stage pipelined ADC includes cascaded circuits of two stages: first-stage cascaded circuit stage1 and second-stage cascaded circuit stage2. The first-stage cascade circuit stage1 includes first ADC (ADC1), residual voltage generation circuit 10, and redundant amplifier RA. The second-stage cascade circuit stage2 includes second ADC (ADC2). The difference between the present disclosure and FIG. 1 is that the residual voltage generation circuit 10 in the present disclosure is further provided with common mode voltage ADC (ADC1_CM) and digital signal processing module 20. The common mode voltage ADC (ADC1_CM) receives input signals VIP and VIN and converts a common mode voltage (i.e. (VIP+VIN)/2) of the input signals into first digital signal D1_CM<M1-1:0> of M1 bits. The first ADC (ADC1) receives the input signals VIP and VIN and converts the input signals into second digital signal D1<N1-1:0> of N1 bits. The digital signal processing module 20 receives the first digital signal D1_CM<M1-1:0> and the second digital signal D1<N1-1:0> and outputs third digital signal D1P<N1-1:0> and fourth digital signal DIN<N1-1:0>. An encoder outputs first switching control signal SW1P<N1-1:0> and second switching control signal SWIN<N1-1:0> based on the third digital signal D1P<N1-1:0> and the fourth digital signal DIN<N1-1:0>, respectively. Sub-digital-to-analog converter (DAC) (DAC1) receives input signals VIP and VIN and generates residual voltages VP_DAC1 and VN_DAC1 based on the first switching control signal SWIP<N1-1:0> and the second switching control signal SWIN<N1-1:0>, respectively. According to the application situation, the sub-DAC (DAC1) can adopt the structure shown in FIG. 2 or other structures. The residual voltages VP_DAC1 and VN_DAC1 act on two input terminals of the redundant amplifier RA and output amplified signals VIP_ADC2 and VIN_ADC2 as input signals into the second ADC (ADC2) after amplification. In the present disclosure, the common mode voltage ADC (ADC_CM) and the digital signal processing module are set such that the common mode voltage of the residual voltages, i.e., the input common mode voltage of the amplifier RA, is basically independent of the input signal and approximately equal to a set threshold voltage. The first ADC (ADC1) and the common mode voltage ADC (ADC_CM) can adopt a conventional ADC circuit structure. The redundant amplifier RA can adopt the structure shown in FIG. 2 or other types of circuit structures, which will not be elaborated here.

Figure 4:
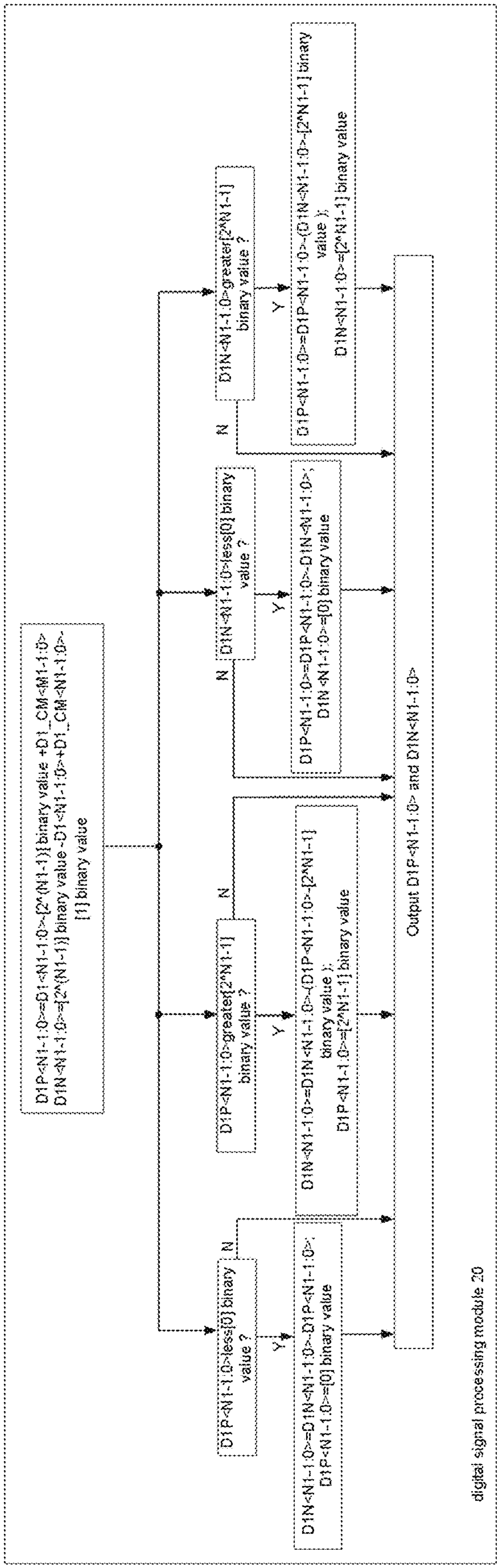
FIG. 4 is a schematic diagram of a digital signal processing module according to the present disclosure.

Furthermore, FIG. 4 is a schematic diagram of the digital signal processing module. FIG. 4 is a schematic diagram of the digital signal processing module 20 when the number of bits M1 of the first digital signal is equal to the number of bits N1 of the second digital signal. The digital signal processing module 20 receives the first digital signal D1_CM<M1-1:0> and the second digital signal D1<N1-1:0> and outputs the third digital signal D1P<N1-1:0> and the fourth digital signal DIN<N1-1:0> after processing. When M1 is equal to N1, the third digital signal D1P<N1-1:0> is equal to a difference by subtracting a binary value corresponding to [2^(N1-1)] from a sum of the first digital signal D1_CM<M1-1:0> and the second digital signal D1<N1-1:0>. The fourth digital signal DIN<N1-1:0> is equal to a difference by subtracting the second digital signal D1<N1-1:0> from a sum of a binary value corresponding to [2^(N1-1)−1] and the first digital signal D1_CM<M1-1:0>. Therefore, the sum of the third digital signal and the fourth digital signal is independent of the second digital signal and only related to the first digital signal, approximately twice the first digital signal (in general, a decimal value corresponding to the first digital signal is much greater than 1). The difference between the third digital signal and the fourth digital signal is equal to the difference between a double value of the second digital signal and the binary value corresponding to [2^N1-1], ensuring the accuracy of the residual voltage. The encoder generates the first switching control signal SW1P<N1-1:0> based on the third digital signal D1P<N1-1:0> and generates the second switching control signal SWIN<N1-1:0> based on the fourth digital signal DIN<N1-1:0>. The sub-DAC (DAC1) receives the input signals VIP and VIN and receives the first switching control signal SWIP<N1-1:0> and the second switching control signal SWIN<N1-1:0>. Thus, the sum of voltages VBP and VBN generated by the sub-DAC (DAC1) at the second terminal of the capacitor array based on the third digital signal D1P<N1-1:0> and the fourth digital signal DIN<N1-1:0> is approximately equal to the sum of the input signals VIP and VIN. When the sub-DAC1 uses the circuit structure shown in FIG. 2, the common mode voltage of the residual voltages is (VP_DAC1+VN_DAC1)/2~VCM. It eliminates the influence of the input signals, and is approximately equal to the set threshold voltage, thereby reducing the fluctuation range and simplifying the difficulty of amplifier design.

Furthermore, in order to prevent the decimal values corresponding to the third digital signal and the fourth digital signal from overflowing a range of 0 to 2^N1-1, as shown in FIG. 4, the digital signal processing module further processes the third digital signal and the fourth digital signal. When the decimal value corresponding to the third digital signal is less than 0, the third digital signal is shifted to 0, and the difference (first difference) between the third digital signal and the fourth digital signal remains unchanged, that is, DIN<N1-1:0>=DIN<N1-1:0>−D1P<N1-1:0>. When the decimal value corresponding to the third digital signal is greater than 2^N1-1, the corresponding decimal value is shifted to 2^N1-1, and the first difference remains unchanged, that is, DIN<N1-1:0>=DIN<N1-1:0>−(D1P<N1-1:0>−[2^N1-1] binary). Similarly, when the decimal value corresponding to the fourth digital signal is less than 0, the fourth digital signal is shifted to 0, and the difference (first difference) between the third digital signal and the fourth digital signal remains unchanged, that is, D1P<N1-1:0>=D1P<N1-1:0>−DIN<N1-1:0>. When the decimal value corresponding to the fourth digital signal is greater than ^N1-1, the corresponding decimal is shifted to 2^N1-1, and the first difference remains unchanged, that is, D1P<N1-1:0>=D1P<N1-1:0>−(DIN<N1-1:0>−[2^N1-1] binary). Through the above settings, the decimal values corresponding to the third digital signal and the fourth digital signal are within the range of 0 to 2^N1-1, and the difference between the third digital signal and the fourth digital signal remains unchanged to ensure the accuracy of the residual voltage. Furthermore, the embodiment shown in FIG. 4 is only one of the embodiments. When the decimal value corresponding to the third digital signal or the fourth digital signal is less than 0 or greater than 2^N1-1, the corresponding decimal value can also be shifted to other values within the range of 0 to 2^N1-1 while the difference digital signal remains unchanged. For example, when the third digital signal is less than 0, the corresponding decimal value is shifted to 1, and the fourth digital signal is set to D1P<N1-1:0>−DIN<N1-1:0>+[1] binary. It should be noted that the digital signal processing module can be implemented in the form of hardware, software, or a combination of software and hardware, and the specific method can be selected and set according to the actual application situation.

When the number of bits M1 of the first digital signal is not equal to the number of bits N1 of the second digital signal, a number-of-bits conversion module is provided in the digital signal processing module 20 to convert the number of bits of the first digital signal to be equal to the number of bits of the second digital signal. The subsequent processing is the same as in FIG. 4 and will not be repeated here.

Figure 5:
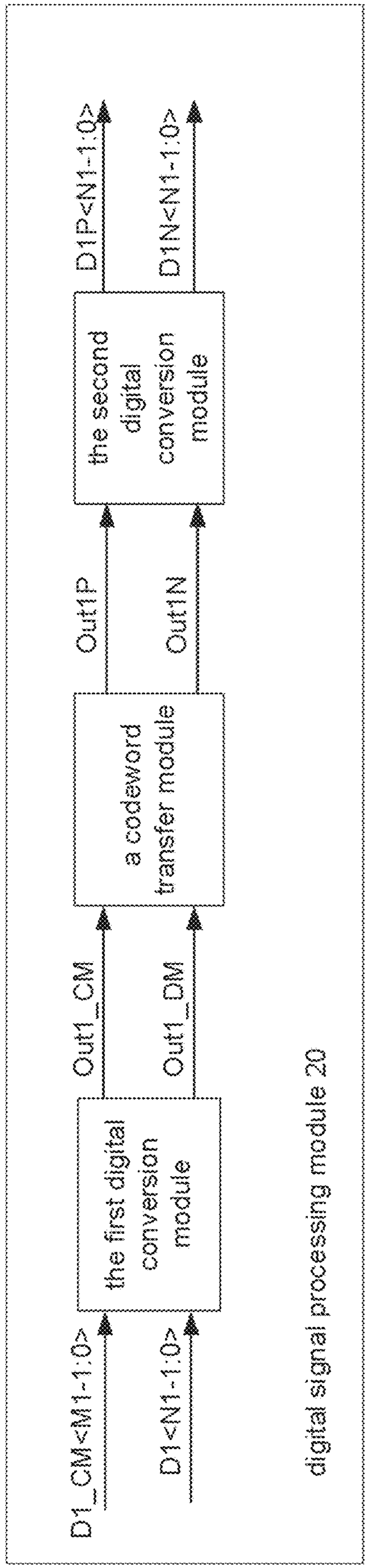
FIG. 5 is another schematic diagram of the digital signal processing module according to the present disclosure.

Furthermore, FIG. 5 shows another schematic diagram of the digital signal processing module. The digital signal processing module 20 includes a first digital conversion module, a codeword transfer module, and a second digital conversion module. The first digital conversion module receives the first digital signal D1_CM<M1-1:0> and the second digital signal D1<N1-1:0>, outputs first conversion signal Out1_CM based on the first digital signal D1_CM<M1-1:0>, and outputs second conversion signal Out1_DM based on the second digital signal D1<N1-1:0>. The codeword transfer module receives the first conversion signal Out1_CM and the second conversion signal Out1_DM, and outputs third conversion signal Out1P and fourth conversion signal Out1N based on these two signals. The sum of the third conversion signal Out1P and the fourth conversion signal Out1N is independent of the second conversion signal Out1_DM and only related to the first conversion signal Out1_CM, approximately twice the first conversion signal Out1_CM. The decimal difference between the third conversion signal Out1P and the fourth conversion signal Out1N is equal to the difference between a double of a decimal value of the second conversion signal Out1_DM and (2^N1-1) to ensure the accuracy of the residual voltage. N1 is the number of bits of the second digital signal. The second digital conversion module receives the third conversion signal Out1P and the fourth conversion signal Out1N, outputs the third digital signal D1P<N1-1:0> based on the third conversion signal Out1P, and outputs the fourth digital signal DIN<N1-1:0> based on the fourth conversion signal Out1N.

The first digital conversion module may include a decimal conversion module. The first conversion signal Out1_CM and the second conversion signal Out1_DM, as well as the third conversion signal Out1P and the fourth conversion signal Out1N, are all decimal signals. The second digital conversion module may include a binary conversion module for converting the third conversion signal Out1P and the fourth conversion signal Out1N into N1-bits digital signals. Of course, the first to fourth conversion signals can also be other types of data, and the present disclosure does not specifically limit this.

Furthermore, the number of bits M1 of the first digital signal D1_CM<M1-1:0> and the number of bits N1 of the second digital signal D1<N1-1:0> can be set to be equal or unequal. When M1 and N1 are not equal, a corresponding number-of-bits conversion module can be provided in the digital signal processing module 20 to make the bit numbers equal before proceeding with subsequent data processing. The specific principle of the number-of-bits conversion module will not be elaborated here.

Figure 6:
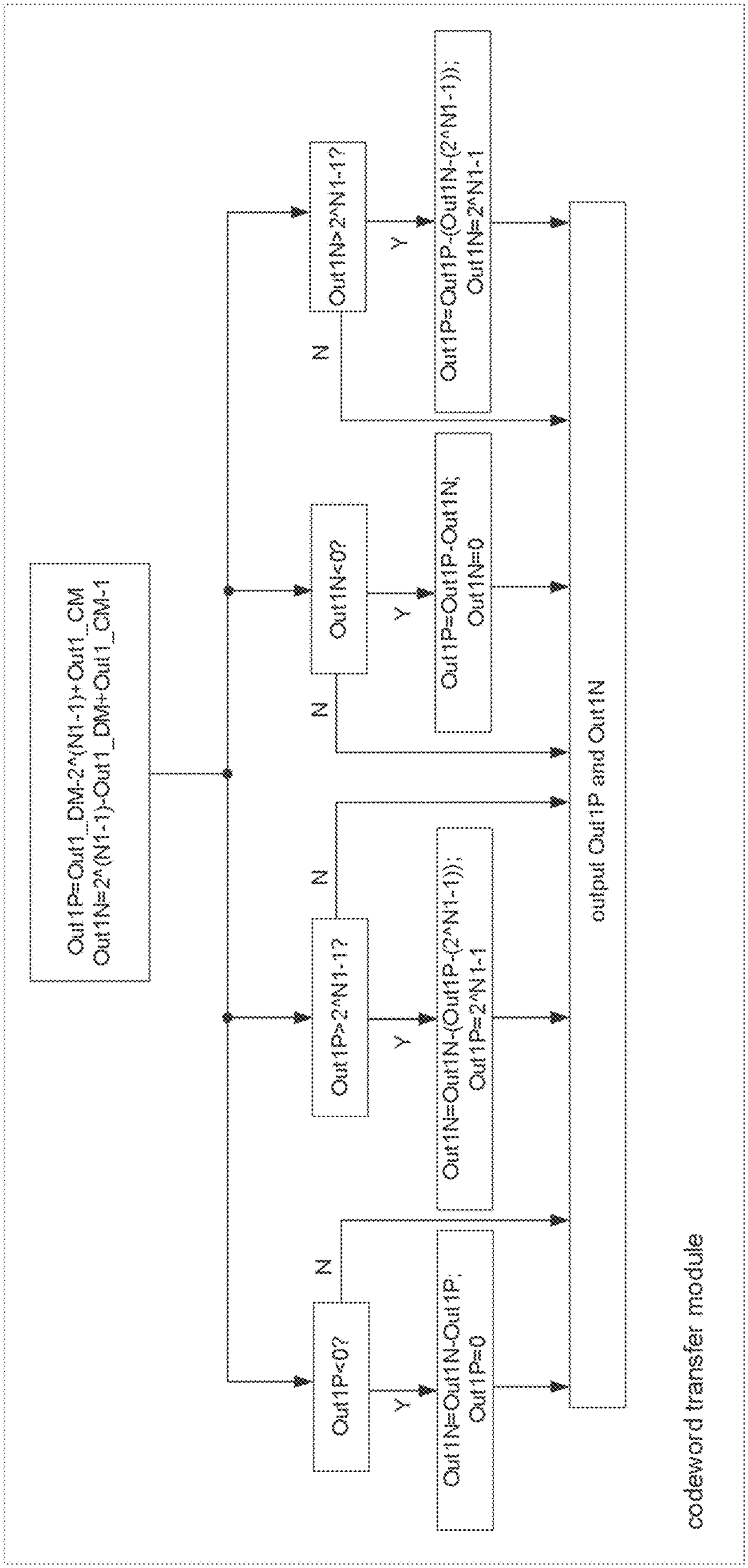
FIG. 6 is a schematic diagram of a codeword transfer module according to the present disclosure.

Furthermore, FIG. 6 is a schematic diagram of the codeword transfer module. Here, M1 is equal to N1, and the first to fourth conversion signals are all decimal signals. The principle of the codeword transfer module is similar to that shown in FIG. 4, with the difference being the data type. The third conversion signal Out1P is equal to a difference by subtracting 2^(N1-1) from a sum of the first conversion signal Out1_CM and the second conversion signal Out1_DM. The fourth conversion signal Out1N is equal to a difference by subtracting the second conversion signal Out1_DM from a sum of 2^(N1-1)−1 and the first conversion signal Out1_CM. It can be seen that the sum of the third conversion signal Out1P and the fourth conversion signal Out1N is approximately twice of the first conversion signal Out1_CM (in general, Out1_CM is much greater than 1). That is, the common mode of the third conversion signal Out1P and the fourth conversion signal Out1N is approximately equal to the first conversion signal Out1_CM. The third digital signal D1P<N1-1:0> and the fourth digital signal DIN<N1-1:0> are generated based on the third conversion signal Out1P and the fourth conversion signal Out1N, respectively. The first switching control signal SW1P<N1-1:0> and the second switching control signal SWIN<N1-1:0> are generated based on the third digital signal D1P<N1-1:0> and the fourth digital signal DIN<N1-1:0>, respectively. Therefore, the sum of the voltages VBP and VBN generated by the sub-DAC (DAC1) at the second terminal of the capacitor array based on the third digital signal D1P<N1-1:0> and the fourth digital signal DIN<N1-1:0> is approximately equal to the sum of the input signals VIP and VIN. When the sub-DAC1 uses the circuit structure shown in FIG. 2, the common mode voltage of the residual voltage is (VP_DAC1+VN_DAC1)/2≈VCM. The design eliminates the influence of the input signals and simplifies the difficulty of amplifier design.

Furthermore, in order to prevent the third conversion signal Out1P and the fourth conversion signal Out1N from overflowing the range of 0 to 2^N1-1, as shown in FIG. 6, the codeword transfer module further compares the third conversion signal Out1P and the fourth conversion signal Out1N with 0 or 2^N1-1 separately. When the third conversion signal Out1P is less than 0, it is shifted to 0 and the difference (first difference) between the third conversion signal Out1P and the fourth conversion signal Out1N remains unchanged. At this point, the fourth conversion signal is Out1N=Out1N−Out1P. When the third conversion signal Out1P is greater than 2^N1-1, it is shifted to 2^N1-1 and the first difference remains unchanged. At this point, the fourth conversion signal is Out1N=Out1N−(Out1P−(2^N1-

1)). Similarly, when the fourth conversion signal Out1N is less than 0, it is shifted to 0 and the first difference remains unchanged. At this point, the third conversion signal is Out1P=Out1P−Out1N. When the fourth conversion signal Out1N is greater than 2^N1-1, it is shifted to 2^N1-1 and the first difference remains unchanged. At this point, the third conversion signal is Out1P=Out1P−(Out1N−(2^N1-1)). Through the above settings, the third conversion signal Out1P and the fourth conversion signal Out1N are within the range of 0 to 2^N1-1, and the difference remains between the third conversion signal and the fourth conversion signal remains unchanged to ensure the accuracy of the residual voltage. The embodiment shown in FIG. 6 is only one of the embodiments. When the third conversion signal or the fourth conversion signal is less than 0 or greater than 2^N1-1, it can also be shifted to other values within the range of 0 to 2^N1-1 while the difference between the third conversion signal and the fourth conversion signal remains unchanged. For example, when the third conversion signal Out1P is less than 0, it is shifted to 1 and the fourth conversion signal Out1N is set equal to Out1N-Out1P+1. It should be noted that the digital signal processing module can be implemented in the form of hardware, software, or a combination of software and hardware, and the specific method can be selected and set according to the actual application situation.

In summary, the residual voltage generation circuit described above is provided with a common mode voltage ADC and a digital signal processing module to make the common mode voltage of the residual voltage stabilized around the set threshold and basically independent of the input signals. The set threshold can be set according to the actual application situation. For example, the set threshold can be set to half of the reference voltage. The above settings avoid large-scale fluctuations in the common mode voltage of residual voltages and reduce the difficulty of amplifier design.

Furthermore, FIG. 3 shows a two-stage pipelined ADC, but the pipelined ADC in the present disclosure is not limited to this and can also be extended to more stages. Specifically, the pipelined ADC includes cascaded circuits of K stages, where K is a positive integer greater than 1. The cascaded structures other than a Kth stage include the residual voltage generation circuit described above. An ith-stage cascaded circuit outputs an ith amplified signal based on the residual voltage generated by the sub-DAC in the ith-stage cascaded circuit, where i is a positive integer greater than or equal to 1 and less than K. The input signal in a first-stage cascade circuit is an analog signal to be converted. The input signals in cascaded circuits of second to Kth stages each are an amplified signal generated by a previous-stage cascaded circuit. The input signal in the ith-stage cascaded circuit is the input signal of the residual voltage generation circuit in the ith-stage cascaded circuit. Based on the second digital signals output by the ADCs in the cascaded structures of first to (K−1)th stages and a fifth digital signal output by the ADC in the Kth-stage cascaded circuit, the pipelined ADC outputs a sixth digital signal through redundant correction. The number of bits of the digital signal output by the cascaded circuit of each stage can be set according to the actual application situation.

Furthermore, the ith-stage cascade circuit includes a redundant amplifier. The redundant amplifier is a differential operational amplifier that is configured to amplify the residual voltage in the ith-stage cascaded circuit and output the ith amplified signal.

Furthermore, the pipelined ADC includes a redundant correction circuit that receives the digital signals output by the cascaded circuit of each stage and adds multiple digital signals through misalignment based on the number of bits of redundant data to output a sixth digital signal.

The present disclosure further provides a residual voltage generation method, including the following steps. The common mode voltage ADC converts the common mode voltage of the input signal into the first digital signal, and the ADC converts the input signal into the second digital signal. The digital signal processing module receives the first digital signal and the second digital signal and outputs the third digital signal and the fourth digital signal. The sub-DAC receives the input signals and the switching control signals generated based on the third digital signal and the fourth digital signal, and outputs the residual voltages. Based on the third digital signal and the fourth digital signal, the common mode voltage of the residual voltages generated by the sub-DAC is approximately equal to the set threshold voltage.

In addition, the residual voltage generation method further includes other functions of the residual voltage generation circuit described above, which will not be repeated here.

In summary, the present disclosure provides a pipelined ADC and a residual voltage generation circuit and generation method thereof. The common mode voltage ADC is provided to convert the common mode voltage of the input signals into the first digital signal. The digital signal processing module is provided to receive the first digital signal and the second digital signal obtained by rough conversion of the input signal by the ADC, and output the third digital signal and the fourth digital signal based on the first digital signal and the second digital signal, respectively. The sub-DAC receives the input signals and the switching control signals generated based on the third digital signal and the fourth digital signal, and outputs the residual voltages. Based on the third digital signal and the fourth digital signal, the common mode voltage of the residual voltages generated by the sub-DAC is approximately equal to the set threshold voltage. That is, it is stabilized around the set threshold voltage. The set threshold can be set according to the actual application situation, for example, it can be set to half of the reference voltage. Through the above settings, the present disclosure avoids large-scale fluctuations in the common mode voltage of the residual voltages and reduces the difficulty of amplifier design.

Finally, it should be noted that the above embodiments are merely examples given for clearly illustrating the present disclosure, and are not intended to limit the implementations. Those of ordinary skill in the art may make modifications or variations in other forms based on the above description. There is no need and no way to exhaust all of the implementations. Obvious modifications or variations made thereto shall still fall within the protection scope of the present disclosure.

What is claimed is:

1. A residual voltage generation circuit, applied to a pipelined analog-to-digital converter (ADC), comprising:

a common mode voltage ADC, configured to receive an input signal and convert a common mode voltage of the input signal into a first digital signal;

an ADC, configured to receive the input signal and convert the input signal into a second digital signal;

a digital signal processing module, configured to receive the first digital signal and the second digital signal and output a third digital signal and a fourth digital signal; and a sub-digital-to-analog converter (DAC), configured to receive the input signal and a switching control signal and output a residual voltage, wherein the switching control signal is generated based on the third digital signal and the fourth digital signal;

wherein based on the third digital signal and the fourth digital signal, a common mode voltage of the residual voltage generated by the sub-DAC is approximately equal to a set threshold voltage.

2. The residual voltage generation circuit according to claim 1, wherein when a number of bits of the first digital signal is equal to a number of bits of the second digital signal, the third digital signal is equal to a difference by subtracting a binary value corresponding to 2ˆ(N1-1) from a sum of the first digital signal and the second digital signal; the fourth digital signal is equal to a difference by subtracting the second digital signal from a sum of a binary value corresponding to (2ˆ(N1-1)−1) and the first digital signal; and N1 denotes the number of bits of the second digital signal; and when the number of bits of the first digital signal is not equal to the number of bits of the second digital signal, the digital signal processing module comprises a number-of-bits conversion module for converting the number of bits of the first digital signal to be equal to the number of bits of the second digital signal; wherein the third digital signal is equal to a difference by subtracting the binary value corresponding to 2ˆ(N1-1) from a sum of the first digital signal converted to hold N1 bits and the second digital signal; and the fourth digital signal is equal to a difference by subtracting the second digital signal from a sum of the binary value corresponding to (2ˆ(N1-1)−1) and the first digital signal converted to hold N1 bits.

3. The residual voltage generation circuit according to claim 2, wherein a difference between the third digital signal and the fourth digital signal is defined as a first difference;

the digital signal processing module is configured to limit decimal values corresponding to the third digital signal and the fourth digital signal to a range of 0 to (2ˆN1-1);

when the decimal value corresponding to the third digital signal is less than 0 or greater than (2ˆN1-1), the decimal value corresponding to the third digital signal is shifted into the range of 0 to (2ˆN1-1), and the first difference remains unchanged; and when the decimal value corresponding to the fourth digital signal is less than 0 or greater than (2ˆN1-1), the decimal value corresponding to the fourth digital signal is shifted into the range of 0 to (2ˆN1-1), and the first difference remains unchanged.

4. The residual voltage generation circuit according to claim 3, wherein the residual voltage generation circuit further comprises an encoder; and the encoder is configured to receive the third digital signal and the fourth digital signal and output a first switching control signal and a second switching control signal; and the sub-DAC is configured to generate the residual voltage based on the input signal, the first switching control signal, and the second switching control signal.

5. The residual voltage generation circuit according to claim 2, wherein the residual voltage generation circuit further comprises an encoder; and the encoder is configured to receive the third digital signal and the fourth digital signal and output a first switching control signal and a second switching control signal; and the sub-DAC is configured to generate the residual voltage based on the input signal, the first switching control signal, and the second switching control signal.

6. The residual voltage generation circuit according to claim 1, wherein the digital signal processing module comprises a first digital conversion module, a codeword transfer module, and a second digital conversion module;

the first digital conversion module is configured to output a first conversion signal based on the first digital signal and output a second conversion signal based on the second digital signal;

the codeword transfer module is configured to output a third conversion signal and a fourth conversion signal based on the first conversion signal and the second conversion signal, and make a sum of the third conversion signal and the fourth conversion signal approximately twice the first conversion signal and a decimal difference between the third conversion signal and the fourth conversion signal equal to a difference between a double of a decimal value of the second conversion signal and (2ˆN1-1); and N1 denotes a number of bits of the second digital signal; and the second digital conversion module is configured to output the third digital signal based on the third conversion signal and output the fourth digital signal based on the fourth conversion signal.

7. The residual voltage generation circuit according to claim 6, wherein when the first to fourth conversion signals are decimal signals, the third conversion signal is equal to a difference by subtracting (2ˆN1-1) from a sum of the second conversion signal and the first conversion signal; and the fourth conversion signal is equal to a difference by subtracting the second conversion signal from a sum of (2ˆ(N1-1)−1) and the first conversion signal.

8. The residual voltage generation circuit according to claim 7, wherein a difference between the third conversion signal and the fourth conversion signal is defined as a first difference;

the codeword transfer module is configured to limit the third conversion signal and the fourth conversion signal to a range of 0 to (2ˆN1-1);

when the third conversion signal is less than 0 or greater than (2ˆN1-1), the third conversion signal is shifted into the range of 0 to (2ˆN1-1), and the first difference remains unchanged; and when the fourth conversion signal is less than 0 or greater than (2ˆN1-1), the fourth conversion signal is shifted into the range of 0 to (2ˆN1-1), and the first difference remains unchanged.

9. The residual voltage generation circuit according to claim 1, wherein the set threshold voltage is half of a reference voltage.

10. The residual voltage generation circuit according to claim 1, wherein the residual voltage generation circuit further comprises an encoder; and the encoder is configured to receive the third digital signal and the fourth digital signal and output a first switching control signal and a second switching control signal; and the sub-DAC is configured to generate the residual voltage based on the input signal, the first switching control signal, and the second switching control signal.

11. The residual voltage generation circuit according to claim 10, wherein the sub-DAC comprises a first capacitor array and a second capacitor array; a first terminal of the first capacitor array is connected to a common mode signal through a first switch; and in the first capacitor array, a second terminal of a capacitor is connected to one of a positive terminal of the input signal, a positive terminal of the reference voltage, and a negative terminal of the reference voltage through a first switch array;

a first terminal of the second capacitor array is connected to the common mode signal through a second switch; and in the second capacitor array, a second terminal of a capacitor is connected to one of a negative terminal of the input signal, the positive terminal of the reference voltage, and the negative terminal of the reference voltage through a second switch array;

in a sampling phase, the first switch and the second switch are closed, a second terminal of the first capacitor array is connected to the positive terminal of the input signal, and a second terminal of the second capacitor array is connected to the negative terminal of the input signal; and in a residual voltage generation phase, the first switch and the second switch are opened, the first switch array is controlled by the first switching control signal, and the second switch array is controlled by the second switching control signal.

12. A pipelined ADC, comprising cascaded structures of K stages, K being a positive integer greater than 1, wherein a cascaded structure other than a Kth stage comprises the residual voltage generation circuit according to claim 1;

an ith-stage cascaded circuit is configured to output an ith amplified signal based on the residual voltage generated by the sub-DAC in the ith-stage cascaded circuit, i being a positive integer greater than or equal to 1 and less than K;

an input signal in a first-stage cascade circuit is an analog signal to be converted; and input signals in cascaded circuits of second to Kth stages each are an amplified signal generated by a previous-stage cascaded circuit;

the input signal in the ith-stage cascaded circuit is the input signal of the residual voltage generation circuit in the ith-stage cascaded circuit; and based on the second digital signals output by the ADCs in the cascaded structures of first to (K−1)th stages and a fifth digital signal output by the ADC in the Kth-stage cascaded circuit, the pipelined ADC outputs a sixth digital signal through redundant correction.

13. The pipelined ADC according to claim 12, wherein the ith-stage cascade circuit comprises a redundant amplifier; and the redundant amplifier is a differential operational amplifier, wherein the differential operational amplifier is configured to amplify the residual voltage in the ith-stage cascaded circuit and output the ith amplified signal.

14. A residual voltage generation method, comprising the following steps:

converting, by a common mode voltage ADC, a common mode voltage of an input signal into a first digital signal;

converting, by an ADC, the input signal into a second digital signal;

receiving, by a digital signal processing module, the first digital signal and the second digital signal, and outputting a third digital signal and a fourth digital signal; and receiving, by a sub-DAC, the input signal and a switching control signal generated based on the third digital signal and the fourth digital signal, and outputting a residual voltage;

wherein based on the third digital signal and the fourth digital signal, a common mode voltage of the residual voltage generated by the sub-DAC is approximately equal to a set threshold voltage.

15. The residual voltage generation method according to claim 14, wherein the step of receiving, by the digital signal processing module, the first digital signal and the second digital signal, and outputting the third digital signal and the fourth digital signal comprises:

when a number of bits of the first digital signal is equal to a number of bits of the second digital signal, the third digital signal is equal to a difference by subtracting a binary value corresponding to 2^(N1-1) from a sum of the first digital signal and the second digital signal; the fourth digital signal is equal to a difference by subtracting the second digital signal from a sum of a binary value corresponding to (2^(N1-1)−1) and the first digital signal; and N1 denotes the number of bits of the second digital signal; and when the number of bits of the first digital signal is not equal to the number of bits of the second digital signal, the digital signal processing module comprises a number-of-bits conversion module for converting the number of bits of the first digital signal to be equal to the number of bits of the second digital signal; wherein the third digital signal is equal to a difference by subtracting the binary value corresponding to 2^(N1-1) from a sum of the first digital signal converted to hold N1 bits and the second digital signal; and the fourth digital signal is equal to a difference by subtracting the second digital signal from a sum of the binary value corresponding to (2^(N1-1)−1) and the first digital signal converted to hold N1 bits.

16. The residual voltage generation method according to claim 15, wherein a difference between the third digital signal and the fourth digital signal is defined as a first difference;

the digital signal processing module is configured to limit decimal values corresponding to the third digital signal and the fourth digital signal to a range of 0 to (2^N1-1);

when the decimal value corresponding to the third digital signal is less than 0 or greater than (2^N1-1), the decimal value corresponding to the third digital signal is shifted into the range of 0 to (2^N1-1), and the first difference remains unchanged; and when the decimal value corresponding to the fourth digital signal is less than 0 or greater than (2^N1-1), the decimal value corresponding to the fourth digital signal is shifted into the range of 0 to (2^N1-1), and the first difference remains unchanged.

17. The residual voltage generation method according to claim 14, wherein the step of receiving, by the digital signal processing module, the first digital signal and the second digital signal, and outputting the third digital signal and the fourth digital signal comprises: outputting, by the first digital conversion module, a first conversion signal based on the first digital signal, and outputting a second conversion signal based on the second digital signal;

outputting, by a codeword transfer module, a third conversion signal and a fourth conversion signal based on the first conversion signal and the second conversion signal, and making a sum of the third conversion signal and the fourth conversion signal approximately twice the first conversion signal and a decimal difference between the third conversion signal and the fourth conversion signal equal to a difference between a double of a decimal value of the second conversion signal and (2ˆN1-1), wherein N1 denotes a number of bits of the second digital signal; and outputting, by a second digital conversion module, the third digital signal based on the third conversion signal, and outputting the fourth digital signal based on the fourth conversion signal.

18. The residual voltage generation method according to claim 17, wherein when the first to fourth conversion signals are decimal signals, the third conversion signal is equal to a difference by subtracting (2ˆN1-1) from a sum of the second conversion signal and the first conversion signal; and the fourth conversion signal is equal to a difference by subtracting the second conversion signal from a sum of (2ˆ(N1-1)−1) and the first conversion signal.

19. The residual voltage generation method according to claim 18, wherein a difference between the third conversion signal and the fourth conversion signal is defined as a first difference;

the codeword transfer module is configured to limit the third conversion signal and the fourth conversion signal to a range of 0 to (2ˆN1-1);

when the third conversion signal is less than 0 or greater than (2ˆN1-1), the third conversion signal is shifted into the range of 0 to (2ˆN1-1), and the first difference remains unchanged; and when the fourth conversion signal is less than 0 or greater than (2ˆN1-1), the fourth conversion signal is shifted into the range of 0 to (2ˆN1-1), and the first difference remains unchanged.

20. The residual voltage generation method according to claim 14, wherein the set threshold voltage is half of a reference voltage.

* * * * *